United States Patent
Hulyalkar

[19]

[11] Patent Number: 5,878,086
[45] Date of Patent: Mar. 2, 1999

[54] METHOD AND APPARATUS FOR PRODUCING A DETERMINISTIC SEQUENCE FROM AN IIR FILTER

[75] Inventor: Samir N. Hulyalkar, White Plains, N.Y.

[73] Assignee: Philips Electronics North America Corporation, New York, N.Y.

[21] Appl. No.: 715,949

[22] Filed: Sep. 19, 1996

[51] Int. Cl.[6] ............................. H04N 5/21; H04N 7/015
[52] U.S. Cl. .......................... 375/285; 375/296; 375/349; 375/350; 348/21; 348/470; 348/608; 364/724.17
[58] Field of Search .................... 375/231, 232, 375/233, 266, 285, 296, 349, 350; 348/21, 470, 607, 608, 611, 613, 614; 364/724.13, 724.2, 724.17; 333/18

[56] References Cited

U.S. PATENT DOCUMENTS

| | | | |
|---|---|---|---|
| 5,151,785 | 9/1992 | Citta | 358/141 |
| 5,289,395 | 2/1994 | Nagel et al. | 364/724.01 |
| 5,291,291 | 3/1994 | Eilers | 348/723 |
| 5,440,347 | 8/1995 | Guan | 348/466 |
| 5,561,468 | 10/1996 | Bryan et al. | 348/49 |
| 5,602,583 | 2/1997 | Citta | 348/21 |

FOREIGN PATENT DOCUMENTS

WO9621304  7/1996  WIPO ............... H04L 25/03

*Primary Examiner*—Amanda Le
*Attorney, Agent, or Firm*—Leroy Eason

[57] ABSTRACT

A method and apparatus for improved interference rejection, where the rejection is being accomplished by an IIR filter at the transmitter with complementary characteristics to an FIR filter of the receiver, such as a Tomlinson-Harashima transmit-precoder. The improvement is accomplished by providing the ability to preset the transmit and receive filters to the same state, thereby allowing for subsequent receptions to be deterministic. This method and apparatus is particularly useful for correcting for time-varying interference through the use of repeatable, deterministic, training sequences.

5 Claims, 3 Drawing Sheets

METHOD AND APPARATUS FOR PRODUCING A DETERMINISTIC SEQUENCE FROM AN IIR FILTER

BACKGROUND OF THE INVENTION

1. Field of the Invention

This invention generally relates to digital signal transmission and processing, and specifically to a method and apparatus for combatting interference through the use of deterministic sequences, such as training patterns. It is particularly applicable for combatting co-channel and multipath interference for High Definition Television (HDTV) transmission.

2. Discussion of the Related Art

In "Method and Apparatus for Combating Co-channel NTSC Interference for Digital TV Transmission", U.S. Pat. No. 5,452,015, a precoding approach is described in an HDTV transmitter to combat the effects of co-channel NTSC interference. A technique for equalization based on precoding at the transmitter and filtering at the receiver is presented in "New Automatic Equalizer Employing Modulo Arithmetic", Electronic Letters, pages 138–139, March 1971, and in "Matched-Transmission Technique for Channels with Intersymbol Interference", IEEE Transactions on Communications, pages 774–780, August 1972, which are incorporated by reference herein. This approach will hereinafter be referred to as the Tomlinson-Harashima approach.

Co-channel interference can be expected to be located at particular frequencies, as compared to "white noise" which is characterized as being spread randomly across the frequency spectrum. To minimize the effect of co-channel interference, the receiver filter described in the '015 patent is designed to attenuate the received signal at select frequencies. In so doing, however, the receiver filter will also attenuate the desired signal at these frequencies, therein introducing signal degradation.

The transmitter-precoding receiver-filtering approach of Tomlinson-Harashima has been developed to allow for the attenuation of the interference which may be added to the desired signal, without attenuating the desired signal. Conceptually, such an effect can be accomplished by having the transmitter accentuate the signal at the frequencies which the receiver filter attenuates, so that the attenuation at the receiver produces the original, unaccentuated, signal. Unfortunately, a direct application of the inverse of the receiver at the transmitter is not practical. In the HDTV co-channel interference case, for example, accentuating the transmit signal at the co-channel frequencies would result in additional interference at that co-channel. Each TV channel would, in effect, increase their interference to other TV channels, which would be counter-productive to a scheme intended to combat such interference.

The Tomlinson-Harashima approach provides for an effective accentuation at the select frequencies without adding significant interference at these frequencies by employing a modulo M, non-linear, precoding of the signals. This non-linear precoding spreads the interference across the bandwidth, which appears to the receiver as random white noise, which has little effect on the overall receive quality at the cochannels.

As described in the '015 patent, the transmit-precoder employing the Tomlinson-Harashima approach comprises a modulo M reducer whose output is fed back through a filter with the inverse characteristics of the receiver filter, as shown in FIG. 1. Characteristically, the transmit-precoder can be described as a non-linear Infinite Impulse Response (IIR) filter whose feedback characteristics are the inverse of the feed forward characteristics of the Finite Impulse Response (FIR) filter at the receiver.

In "VSB Transmission System: Technical Details," Feb. 18, 1994, incorporated by reference herein, it was proposed that a periodic training sequence be utilized in HDTV transmission to enable equalization and minimize the effects of transmission channel distortions such as tilt and ghosts. The operation of the training sequence in conjunction with the precoder-filter approach is described in copending application Ser. No. 8/550,128, which issued on Feb. 11, 1997 as U.S. Pat. No. 5,602,602. The training sequence undergoes the same precoding as the data signals, and undergoes the same filtering at the receiver as the data signals. Since the training sequence is known, any differences between the received training sequence and the true training sequence is an indication of interference which has not been eliminated by the receive filter. Environmental factors, such as multipath reception caused by the reflection of the transmitted signal off a building, produce frequency dependent distortions. The observed difference between the true training sequence and the received training sequence is used to adjust the filter characteristics of the particular receiver to reduce such environment dependent interference. Similar environmental and location dependent interferences would exist with cable or other forms of data transmissions, for which this training sequence approach would also be effective.

Difficulties exist, however, with the combination of training sequences and the precoding-filtering approach. Ideally, the received training sequence should be directly comparable to a predefined true training sequence. This would allow for an unbiased determination of the actual difference between what was transmitted and what was received. Because the precoder at the transmitter is an IIR filter, which is characterized as having infinite memory, the precoded transmitted sequence will be different at each transmission, even though the same training sequence is used each time. The actual transmitted signal is a combination of the signal to be sent at this time plus every signal which was ever sent by the transmitter at prior times. The transmitted signal, and hence the received signal, is said to be non-deterministic, because of this infinite memory. Communication systems routinely determine the original, non-precoded, data without knowing the infinity of prior transmissions. This determination is complicated by the fact that the precoding is non-linear, but the fact that the transmitted information is not exactly the same as the original information is of no consequence for communications because other techniques exist for correcting errors. For receiver training, however, the training methods can only approximate the difference between the received and transmitted training sequence, because the actual transmitted data is unknown at the receiver. This approximation is effective for minimizing distortions which are not too severe and generally time-invariant, but the lack of a deterministic pattern precludes correction for distortions which are characterized by severe distortions or rapidly time varying phenomena. That is, direct comparisons of the differences from one training sequence to the next cannot be made, because the transmitted sequence is caused to be different each time by the IIR filter, and the effects of non-linear filtering cannot be distinguished from the effects of interference.

SUMMARY OF THE INVENTION

Essentially, the invention describes a method of producing a deterministic sequence from an IIR filter, thereby allowing for improved signal processing capability at the receiver, particularly when the IIR filter contains a non-linear element.

As specifically envisioned for use in a HDTV digital transmission system, this invention describes a method of presetting the transmitter precoder and the receiver filter when the training signal is to be sent, so that the receiver can utilize a deterministic received training sequence to perform equalization. This presetting is accomplished by switching the signal used in the feedback path to the IIR in the precoder to force the IIR memory to a known state. Conceptually, the presetting is accomplished by converting the IIR, infinite memory, filter to an FIR, finite memory, filter and presetting this finite memory, and then converting it back to an IIR, infinite memory, filter. At the same time, the same preset pattern is sent, without precoding, to the receiver, so that the receiver's filter can be preset to be identical to the transmit filter.

At the receiver, the information received immediately after this presetting period will be, effectively, from an IIR with a known initial memory state which is identical to the initial state of the receiver FIR filter memory. Subsequent sequences will therefore be determinable with knowledge of the original, non-precoded, transmission sequence. As applied to HDTV digital transmission, this will provide a priori knowledge of the actual transmitted training sequence, so that the difference between the transmitted and received sequences can be measured directly and used for equalization. Also, as applied to HDTV digital transmission, because the IIR will be preset identically at each cycle, time-varying performance measurements and enhancements can be made.

DETAILED DESCRIPTION OF THE PREFERRED EMBODIMENTS OF THE INVENTION

Figure 1:
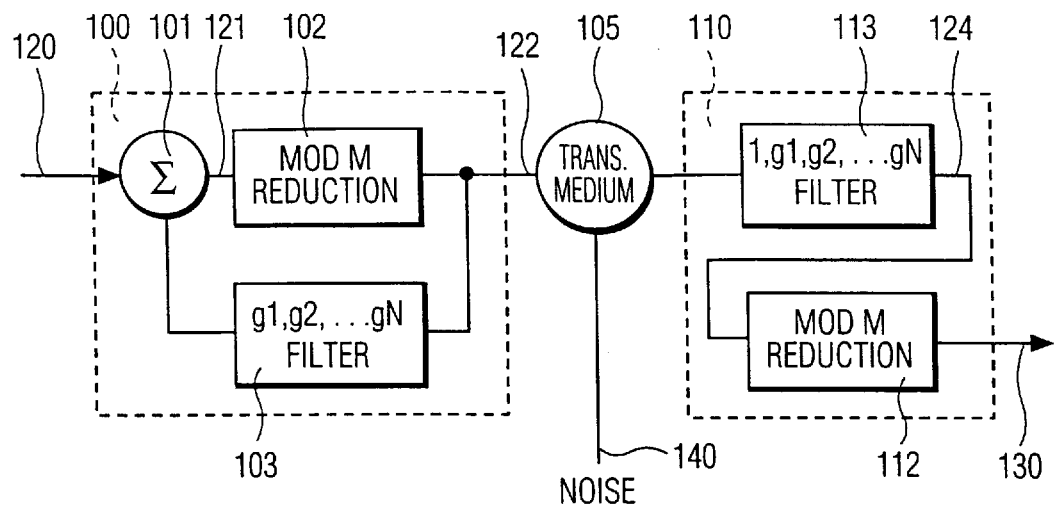
FIG. 1 is a block diagram of a transmit-precoder receive-filter arrangement using the prior art Tomlinson-Harashima precoding.

FIG. 1 shows a transmit-receive pair which employ the transmit-precode receive-filter arrangement using Tomlinson-Harashima precoding. The transmit-precoder 100 and the receive-filter 110 operate in a complementary fashion so that, ideally, after precoding and filtering, the data output 130 is identical to the data input 120. The noise 140 which is introduced by the transmission medium 105, however, is filtered by the receive-filter, as desired.

The receiver rejection filter 113 is an FIR filter with taps of [1, g1, g2, . . . , gN]. Constraining the first tap of the receive filter to be 1 allows for the inverse transmit precoder filter 103 to have the taps of [g1, g2, . . . , gN].

At the transmitter, the data input 120 is combined with the output of the precoder filter 103 at the summer 101. Because the transmit filter is designed to accentuate the input, for subsequent attenuation by the receiver filter, the output 121 from the summer 101 can be large. The Mod M reduction block 102 clips the output 121 to form a bounded signal 122. This signal 122 is transmitted to the receiver via transmission medium 105. This transmission medium consists of the equipment and environment employed to produce a corresponding received signal 123 at the receiver location. During the transmission process, noise 140 (e.g. co-channel interference) may be added to the transmitted signal 122, and the received signal 123 will not be identical to the transmitted signal 122.

At the receiver, the receive filter 110 consists of a rejection filter 113 and a Mod M reduction element 112. This filter is intended to reduce the noise component of the received signal 123 so as to produce a data output 130 which is, ideally, identical to data input 120. The taps of rejection filter 113 are those necessary to effect this noise reduction. The mod M reduction element 112 reverses the effect of the mod M reduction element 102 and each have the same characteristics. The design of such a Tomlinson-Harashima precoder-filter arrangement is well established in the art.

Figure 2:
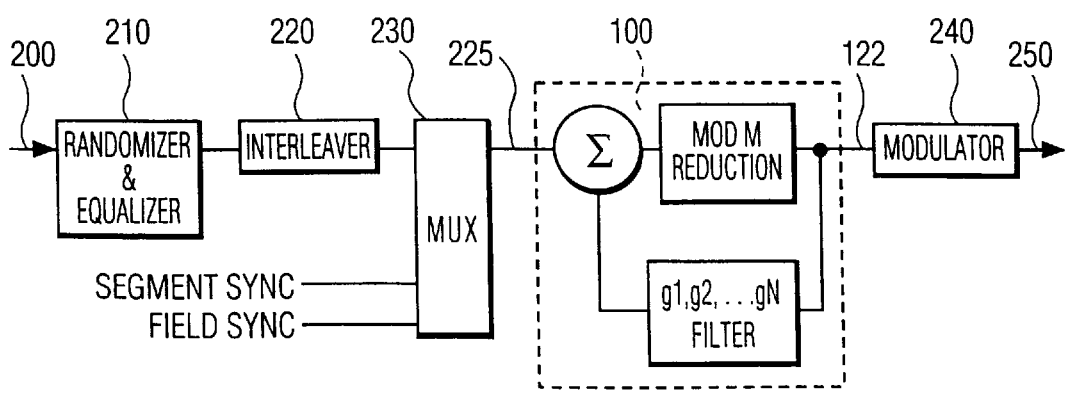
FIG. 2 is a block diagram of an HDTV transmitter with a prior art precoder.

FIG. 2 shows a block diagram of an HDTV transmitter which employs a precoder 100. The data to be transmitted 200 is in a digital format, such as MPEG. In accordance with "VSB Transmission System: Technical Details,", the incoming data is randomized, encoded, and interleaved, to provide a very robust, error correctable, data signal 225. This data signal is framed by signals 260 and 270 which synchronize the receiver to this transmit stream. A training sequence is specified to be included in the field sync pattern 270. The multiplexer 230 will produce an output 120 for the precoder 100 to produce the precoded output 122, as described above. This precoded signal 122 is modulated at 240 to produce a signal 250 which can be propagated to a receiver.

Figure 3:
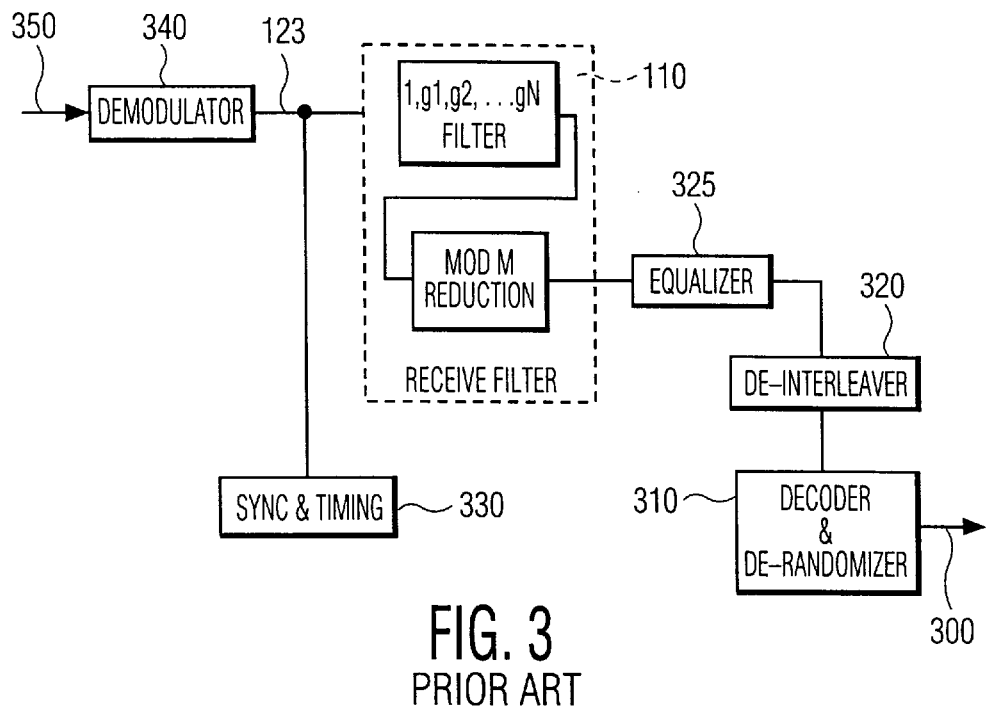
FIG. 3 is a block diagram of an HDTV receiver with a prior art filter.

FIG. 3 shows a block diagram of an HDTV receiver which employs a filter 110. A received signal 350 is demodulated by demodulator 340 to produce a demodulated signal 123. This demodulated signal is also used to establish synchronization and timing in block 330, utilizing the sync signals 260 and 270 which were added to the data signal by the multiplexer 230 in the transmitter. The demodulated signal 123 is processed by the filter 110 to produce a data output 130, as described above. This data output is further filtered by the equalizer 325, and subsequently de-interleaved, de-coded, and de-randomized to produce a data output 300 which, ideally, is identical to data input 200 in FIG. 2.

Figure 4:
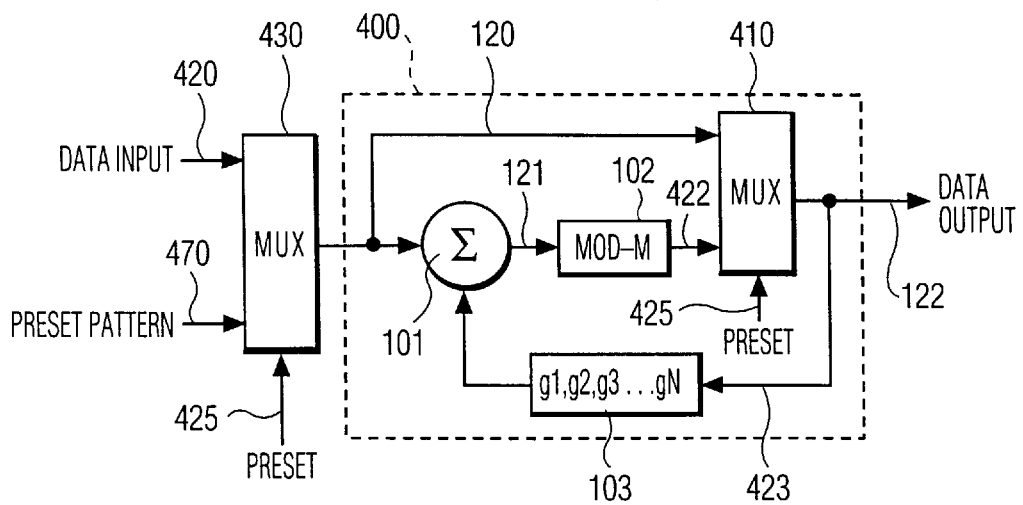
FIG. 4 is a block diagram of the modified precoder in accordance with this invention.

FIG. 4 shows a transmit precoder 400 which is modified in accordance with this invention. The data input 120 thereto contain the pattern which is intended to be used to preset the filter memory at both the transmitter and the receiver. For clarity, this is shown conceptually as a data signal 420 and a preset pattern 470, the selection of which is controlled by mux 430 to produce the data input 120. This multiplexing may be incorporated at the system level; for example, in the preferred embodiment for HDTV, the preset pattern is specified to be contained in the field sync pattern 270, and the multiplexing is performed in the mux 230 as part of the overall system operation, as shown in FIG. 2.

The modified transmit-precoder 400 in FIG. 4, as compared to the precoder 100 of FIG. 1, contains an additional multiplexer 410. This multiplexer operates so as to break the feedback path from the output of the mod M reduction element 102 to the filter 103, and in its stead, provide the signal 120. That is, during the preset interval, a preset signal 425 is asserted. This preset signal controls the operation of the mux 410 and connects input signal 120 directly to output signal 122 when asserted; when not asserted, it connects the output 422 of the mod M reduction element 102 to the data output 122, and operates as the transmit-precoder 100 of FIG. 1. The data output 122 of the mux 410 is the input 423 to the filter 103 which has N-taps. If the preset signal is asserted for N continuous time periods, this N-tap filter will be preset to the values contained in the preset pattern at these N time periods. When the preset signal is deasserted, the transmit-precoder 400 will operate as an IIR filter with a known initial memory state. In so doing, the resultant data output will be deterministic from the time of the last preset operation. The assertion of the preset signal will be determined by the system architecture. Typically, the preset signal will occur periodically, usually in conjunction with the synchronization scheme established by the transmission protocol specification. Consistent with this invention, however, the preset signal could be asserted whenever the generation of a deterministic pattern is desired. For example, the receiving system may request such reinitialization directly, for example, when changing channels, or a system monitoring device may initiate the preset based on some observed performance factors.

In the exemplary embodiment for HDTV, the preset signal is asserted periodically, with each occurrence of the field sync. The precoder filter 103 for HDTV has fifty one taps. The field sync 270 is specified to contain fifty one symbols at its start for presetting the filter 103. These 51 symbols are followed by a training sequence, which consists of 511 symbols. The symbols employed for the training sequence are defined and known a priori to the receiver. In accordance with "VSB Transmission System: Technical Details,", this sync pattern will be multiplexed onto the data stream periodically, every 24.2 milliseconds. Thus, being preset to the same state as the transmitter, the receiver will be able to determine any differences introduced by noise and other interferences directly, by comparing the filtered out put to the predefined training sequence. Since the 51 preset patterns and the 511 training patterns will be repeated, exactly, every 24.2 milliseconds, time varying effects can be measured by comparing the signals received at these 24.2 millisecond intervals.

Figure 5:
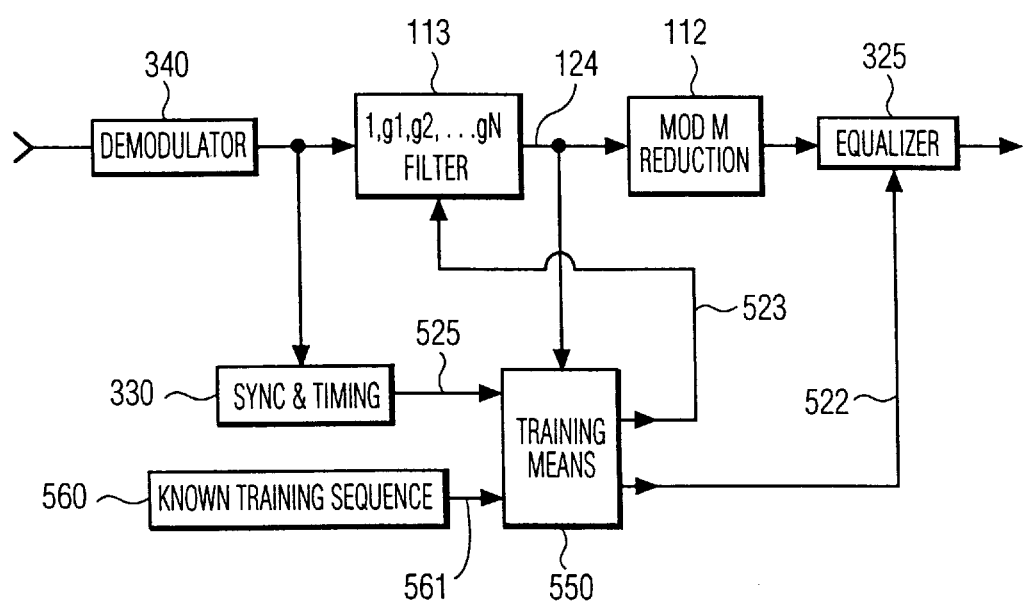
FIG. 5 is a block diagram of a corresponding receiver-filter in accordance with this invention.

FIG. 5 is a block diagram of a receiver which is modified to take advantage of this deterministic output from the transmitter. Shown are the affected blocks 113 and 325 of the unmodified receiver shown in FIG. 3. It should be noted that the transmitter as designed in accordance with this invention would be compatible with an unmodified receiver, with the consequence, however, that all the advantages provided by this invention may not be realized in an unmodified receiver. It should also be noted that the processing of a periodically repeating deterministic pattern from an IIR filter may be performed by methods not shown in FIG. 5, but which would be apparent to one of ordinary skill in the art.

The output 124 of the filter 113 is input to the training means element 550. Also input to the training means element 550 is the output 561 of the known training sequence element 560. The timing input signal 525 is used to control when the training will occur. Because this invention provides for a deterministic transmitted training sequence, the known training sequence element can produce a determined pattern for independent comparison to the received training sequence. This known training sequence element may produce this sequence from precoded memory, or may generate the sequence using the same methods as employed in the transmitter. As controlled by the timing signal 525, the training means element 550 compares the inputs 124 and 561 and generates correction signals 523 and 522 to dynamically modify the rejection filter 113, or the equalizer 325, or both.

Training means are well known in the art, and FIG. 5 is not intended to constrain the processing of the deterministic sequences from an IIR filter, as provided for in this invention. For example, the training means element 525 could be a microcomputer with memory, and various signal processing and statistical techniques could be employed to provide time-varying data and statistics to other elements of the communications system, or to other diagnostic systems.

Although the specific application of this invention has been presented as a means of improving the reception and processing of HDTV signals, it should be apparent that the periodic generation of a deterministic sequence from a filter with infinite memory, such as an IIR filter, will provide an opportunity for improved processing whenever such a filter is employed. This invention is applicable to any IIR filter, both linear and non-linear, either analog or digital, and is not limited to use in a Tomlinson-Harashima transmit-receive pair.

I claim:

1. A filter device for precoding a data input signal to derive a data output signal, comprising:

a feedback element having an input and an output, a combining element, and a selector element having a first input, a second input, an output, and a control signal, wherein:

said combining element combines the data input signal with the output of the feedback element to produce an output which forms the first input to the selector element, said data input signal forms the second input to the selector element, the output of the selector element is coupled to either the first or the second input of the selector element as determined by said control signal, and the output of the selector element forms the input to the feedback element, so that the input to said feedback element is either the data input signal or a combination thereof with the output of the feedback element, as determined by said control signal.

2. An IIR filter device for precoding a data input signal to derive a data output signal, comprising:

a feedback element with an input, an output, and a memory of finite length, a combining element with a first and second input and an output, a signal processing element with an input and an output, a multiplexing element with a first input, a second input, an output, and a control signal having a first and second state, and means for producing a preset pattern of known signals; characterized in that:

the data input signal forms the first input to the combining element, the output of the feedback element forms the second input to the combining element, the output of the combining element forms the input to the signal processing element, the output of the signal processing element forms the first input to the multiplexing element, the of preset pattern of known signals forms the second input to the multiplexing element, the first input of the multiplexing element forms the output of the multiplexing element when the control signal is in the first state, the second input of the multiplexing element forms the output of the multiplexing element when the control signal is in the second state, and, the output of the multiplexing element forms the input to the feedback element, and also forms the data output signal, so that the memory of the feedback element is preset in accordance with the preset pattern of known signals whenever the control signal is in the second state.

3. A device as in claim 2, wherein the signal processing element is non-linear.

4. A device as in claim 2, wherein that signal processing element performs a modulo M reduction.

5. An IIR filter device in accordance with claim 2, wherein the feedback element is a transversal filter having N-taps.

* * * * *